United States Patent
Rozenblit et al.

(10) Patent No.: US 9,203,416 B2
(45) Date of Patent: Dec. 1, 2015

(54) COMPENSATION OF SLOW TIME-VARYING VARIATIONS IN VOLTAGE CONTROLLED OSCILLATOR (VCO) FREQUENCY IN CELLULAR TRANSCEIVERS

(71) Applicant: Broadcom Corporation, Irvine, CA (US)

(72) Inventors: Dmitriy Rozenblit, Irvine, CA (US); Rahul Magoon, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 122 days.

(21) Appl. No.: 13/914,486

(22) Filed: Jun. 10, 2013

(65) Prior Publication Data

US 2014/0347105 A1 Nov. 27, 2014

Related U.S. Application Data

(60) Provisional application No. 61/826,958, filed on May 23, 2013.

(51) Int. Cl.
H04B 1/403 (2015.01)
H03L 7/07 (2006.01)
H03L 7/099 (2006.01)
H03L 7/08 (2006.01)

(52) U.S. Cl.
CPC .. *H03L 7/08* (2013.01); *Y02B 60/50* (2013.01)

(58) Field of Classification Search
USPC ........ 455/183.1, 190.1, 191.2, 255, 256, 257, 455/258, 259, 574
See application file for complete search history.

(56) References Cited

U.S. PATENT DOCUMENTS

| | | | |
|---|---|---|---|
| 6,993,300 B2* | 1/2006 | Luo et al. | 455/108 |
| 8,253,506 B2* | 8/2012 | Liu et al. | 331/177 V |
| 2006/0145776 A1* | 7/2006 | Shi et al. | 331/175 |
| 2009/0002079 A1* | 1/2009 | Venuti et al. | 331/10 |
| 2010/0123490 A1* | 5/2010 | Marton et al. | 327/156 |
| 2010/0301910 A1* | 12/2010 | Hu et al. | 327/156 |

* cited by examiner

*Primary Examiner* — Blane J Jackson
(74) *Attorney, Agent, or Firm* — Garlick & Markison; Bruce E. Garlick (57) ABSTRACT

Various configurations and arrangements of systems and methods for compensating for variations in VCO output frequencies are described. A system in accordance with the disclosure can include an oscillator circuit including an oscillator, a first variable capacitance diode coupled to the oscillator and a second variable capacitance diode coupled to the oscillator. The system further includes a voltage source configured to apply a first voltage to the oscillator circuit to cause the output signal to comprise a selected frequency, the selected frequency being based on a received reference voltage. The system further includes a controller circuit configured to compare an operating voltage of the oscillator to the reference voltage while the first voltage is applied to the oscillator; and apply a second voltage to the oscillator circuit based on the comparison. The second voltage compensates for a difference between the reference voltage and the first voltage.

20 Claims, 6 Drawing Sheets

COMPENSATION OF SLOW TIME-VARYING VARIATIONS IN VOLTAGE CONTROLLED OSCILLATOR (VCO) FREQUENCY IN CELLULAR TRANSCEIVERS

TECHNICAL FIELD

The present disclosure relates to systems and methods for compensating for time variations of the output frequency of voltage controlled oscillators.

BACKGROUND

Mobile wireless communication devices such as cellular telephones, smartphones, personal digital assistants (PDAs), etc. are typically configured to communicate with other devices over a multitude of different frequencies. As such, mobile wireless communication devices, as well as the devices with which they communication are required to include circuitry capable of generating wireless communication signals at a multitude of different frequencies. Typically, information, such as voice or data, is modulated or encoded on a carrier wave of a certain frequency and the modulated or encoded carrier wave is transmitted from one device to another. In many applications, frequency modulation or phase modulation is used to encode the information onto the carrier wave. In order to maintain a communication session with another device and accurately encode and decode the information to and from the carrier wave, the mobile communication device and the device with which it is communicating "lock" on a selected communication frequency. In many embodiments, a phase locked loop (PLL) is used for generating and locking on a communication frequency. In addition to stabilizing a particular communication channel (keeping it set to a particular frequency), a PLL can be used to generate a signal, module or demodulate a signal, reconstitute a signal with less noise, or multiply or divide a frequency.

BRIEF DESCRIPTION OF THE DRAWINGS

For a more complete understanding of example embodiments of the present disclosure, reference is now made to the following descriptions taken in connection with the accompanying drawings in which.

DETAILED DESCRIPTION OF THE DISCLOSURE

Figure 1:
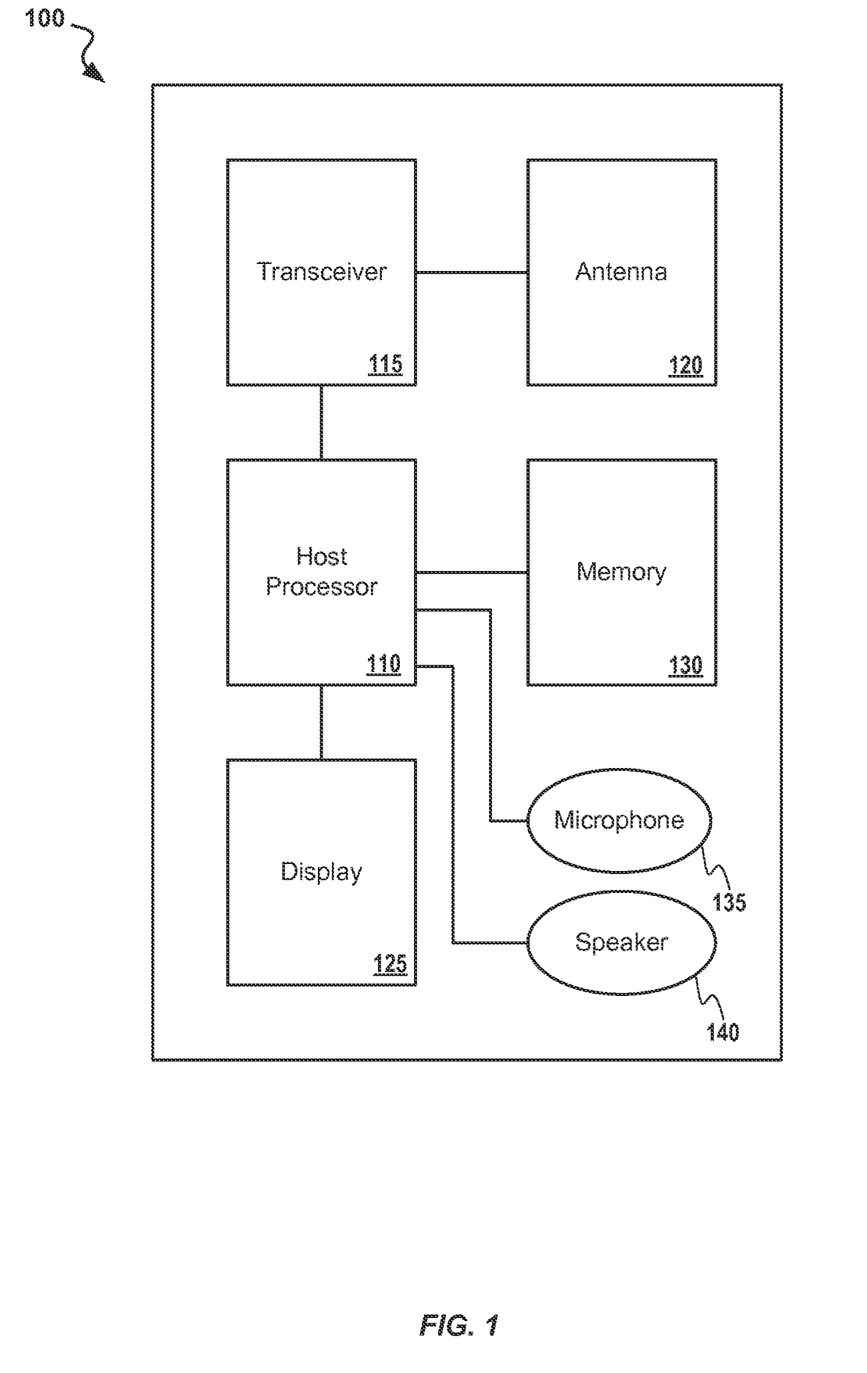
FIG. 1 illustrates a block diagram of an exemplary communication device that utilizes an auxiliary feedback mechanism for compensating for time-variations in VCO frequency.

FIG. 1 is a block diagram of an exemplary communication device 100 that can utilize an auxiliary feedback mechanism for compensating for time-variations in VCO frequency. Referring to FIG. 1, the communication device 100 may include a host processor 110, memory 130, a transceiver 115 and one or more antennas 120. The example communication device 100 may also include a display 125, a microphone 135 and a speaker 140.

The communication device 100 and its components may comprise suitable logic, circuitry, interfaces and/or code that may be operable to perform at the least the functions, operations and/or methods described herein. The communication device 100 may be part of a base station (BS) or part of a user equipment (UE) in a wireless communication system. In an exemplary 3GPP wireless communication system, the BS may be referred to as a node B (NB) (eNB in LTE). In an example multi-input/multi-output (MIMO) communication system, the BS may be referred to as an access point (AP). The UE may be referred to as a station (STA). An AP and/or STA may be utilized in wireless local area network (WLAN) systems.

The one or more antennas 120 may enable the communication device 100 to transmit and/or receive signals, for example RF signals, via a wireless communication medium. The communication device may also be depicted as comprising one or more transmitting antennas, and one or more receiving antennas without loss of generality.

The memory 130 may include a computer-readable memory including removable and non-removable storage devices including, but not limited to, Read Only Memory (ROM), Random Access Memory (RAM), compact discs (CDs), digital versatile discs (DVD), etc. The memory 130 can include program modules that perform particular tasks as described herein. Computer-executable instructions, associated data structures, and program modules represent examples of program code for being executed by the host processor 110 to perform steps of the methods disclosed herein.

The host processor 110 can be configured to control overall operation and/or configuration of the communication device 100. The host processor 110 can also be configured to execute one or more applications such as SMS for text messaging, electronic mailing, audio and/or video recording, and/or other software applications such as a calendar and/or contact list to provide some examples. The host processor 110 may receive information from, among other things, the display 125, microphone 135, and/or speaker 140. The host processor 110 may also receive information from other electrical devices, such as the transceiver 115, or host devices that are coupled to the communication device 100. The host processor 110 can be configured to provide this information to the transceiver 115, display 125, microphone 135, and/or speaker 140.

The display 125, microphone 135, and speaker 140 can be configured as a user interface for the communication device 100 capable of receiving user input and providing information output to the user. For example, in the case of a mobile telephone, the microphone 135 can be used for receiving voice data from the user and the speaker 140 can be used for presenting voice data to the user. The microphone 135 and speaker 140 can also be configured for receiving and confirming verbal commands. The display 125 can be configured as a touch-screen display, an alphanumeric keypad, a mouse, or another suitable input/output device. User provided information can be input into the communication device 100 such as by typing on the alphanumeric keypad, typing or selecting on the touch-screen display, selecting with the mouse, and/or through other methods of receiving user input. Information can be provided to the user by displaying the information on the touch-screen display or through other methods of conveying and/or displaying information.

The transceiver 115 can be configured to send and receive electrical signals via the antenna 120. In general, the transceiver 115 can be configured to encode information, such as voice or data, onto a carrier wave and send the encoded signal via the antenna 120 to another device which, upon receipt, decodes the information from the carrier wave. In a similar manner, the transceiver 115 can be configured to receive an encoded signal via the antenna 120, decode information, such as voice and/or data, from the encoded signal, and pass along the decoded information to the host processor 110 for processing and/or presentation to the user.

Figure 2:
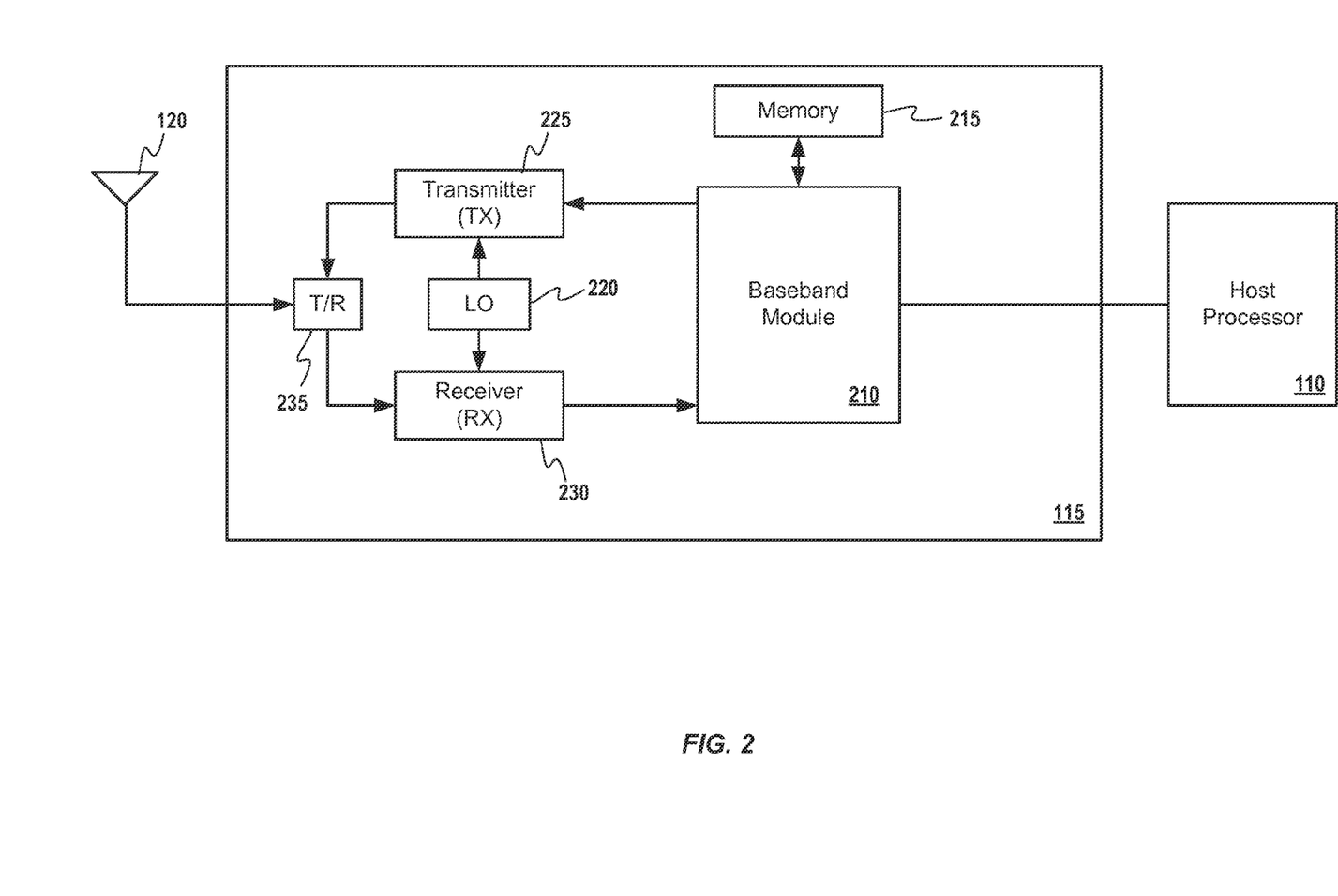
FIG. 2 illustrates a block diagram of an exemplary transceiver that utilizes an auxiliary feedback mechanism for compensating for time-variations in VCO frequency.

FIG. 2 illustrates a block diagram of an exemplary transceiver 115 that can be utilized in the communication device of FIG. 1. The example transceiver 115 includes a baseband module 210 coupled to the host processor 110 and a memory 215. The memory 215 can be a part of the memory 130 in FIG. 1 or separate memory. The host processor 110 causes the baseband module 210 to modulate data (e.g., data representing voice received from the microphone 135 or data stored in the memory 215) to be transmitted via a transmitter 225 and the one or more antenna 120. The host processor 110 can also cause the baseband module 210 to demodulate data representing voice and or any form of media that is received via a receiver 230 and the one or more antenna 120. The modulated data is received from and communicated to the antenna 120 via a duplexer 235.

The transmitter 225 may enable the generation of signals, which may be transmitted via selected antennas 120. The transmitter 225 may generate signals by performing coding functions, signal modulation and/or signal modulation. The receiver 230 may enable the processing of signals received via the selected antennas 120. The receiver 230 may generate data based on the received signals by performing signal amplification, signal demodulation and/or decoding functions.

A local oscillator 220 may be a variable frequency oscillator that is configured to generate a carrier signal that is used to up-convert or down-convert signals to be transmitted or received by the antenna 120. The local oscillator 220 is controlled by the host processor 110 to produce a frequency that is matched to the antenna 120 such that a radio signal is properly shifted up to or down from a selectable carrier frequency. The local oscillator 220 can be controlled, at least in part, using a frequency synthesizer that includes an auxiliary feedback mechanism for compensating for time-variations in voltage controlled oscillator (VCO) frequency in accordance with the disclosure.

Figure 3:
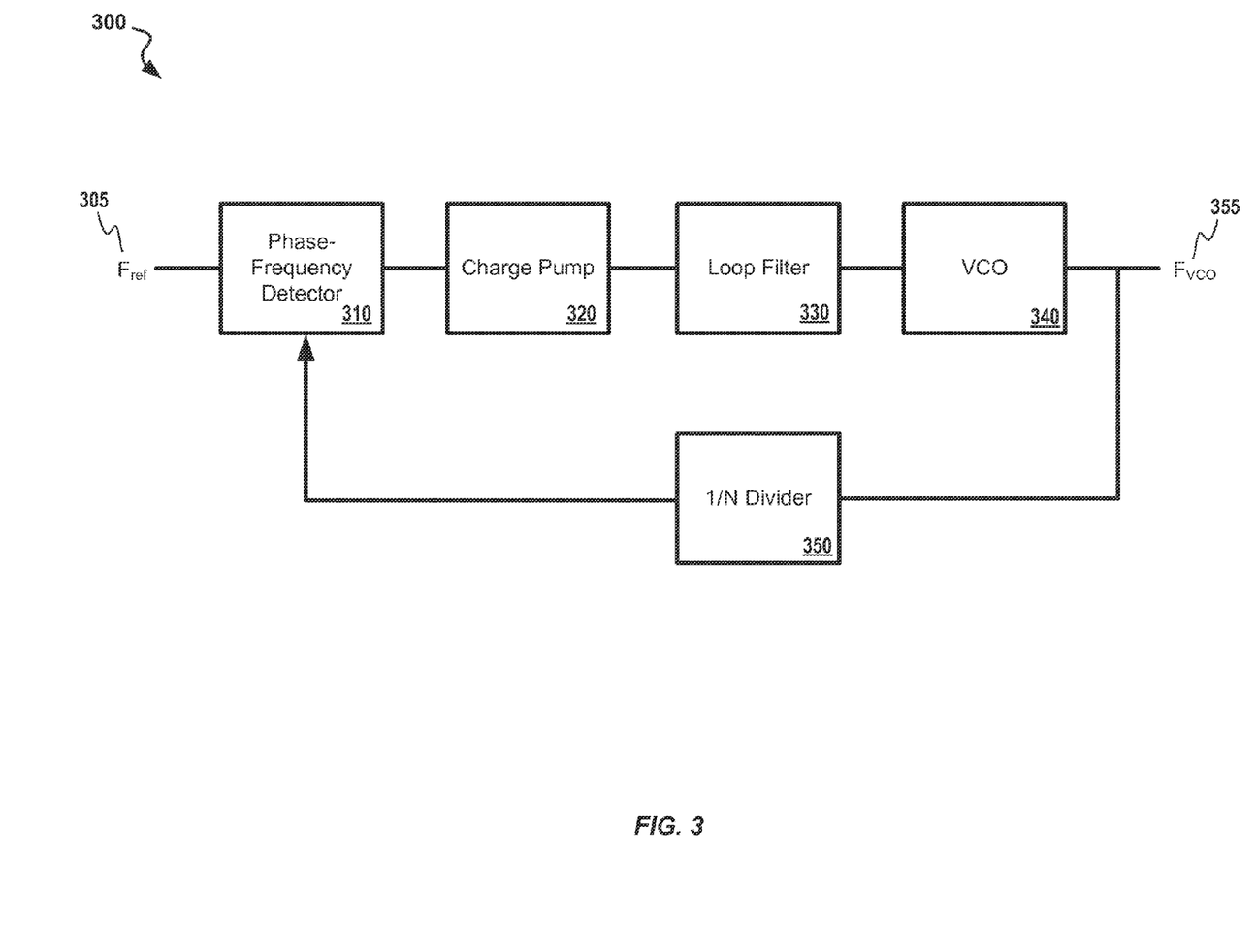
FIG. 3 illustrates a block diagram of an exemplary phase locked loop (PLL) that utilizes an auxiliary feedback mechanism for compensating for time-variations in VCO frequency.

FIG. 3 illustrates a block diagram of an exemplary phase locked loop (PLL) 300 that can be utilized by the communication device of FIG. 1 and the local oscillator 220 of FIG. 2. The PLL 300 includes a phase-frequency detector 310, a charge pump 320, a loop filter 330, a voltage controlled oscillator (VCO) 340 and a feedback divider 350.

The PLL 300 is used to provide a local oscillator (e.g., the local oscillator 220) up-conversion during transmission and down-conversion during reception. The phase-frequency detector 310 compares two input signals and produces an error signal which is proportional to their phase difference. The two input signals include a reference phase signal at a reference frequency $F_{ref}$ and an output phase signal at the output frequency $F_{VCO}$ of the VCO. The charge pump 320 is a converter that uses capacitors as energy storage elements to create either a higher or lower voltage power source depending on the sign (positive negative) of the error signal. The output voltage of the charge pump is proportional in magnitude to the error signal output by the phase-frequency detector 310. The voltage output by the charge pump 320 is then low-pass filtered by the loop filter 330 and used to drive the VCO 340 which creates an output phase signal at the $F_{VCO}$ frequency. The output signal $F_{VCO}$ is fed through the optional feedback divider 350 to the input of the phase-frequency detector 310, producing a negative feedback loop. If the output phase drifts, the error signal will increase, driving the VCO phase in the opposite direction so as to reduce the error. Thus the output phase is locked to the phase at the other input. The optional feedback divider 350 is equivalent to a frequency synthesizer. For example, a divider value of N=2 will produce and output frequency equal to twice the input reference frequency $F_{ref}$.

A primary function of the loop filter 330 is to ensure loop dynamics or stability. This determines how the loop responds to disturbances, such as changes in the reference frequency, changes of the feedback divider, or at startup. Some possible considerations in designing the loop filter 330 include the range over which the loop filter 330 can achieve lock (pull-in range, lock range or capture range), how fast the loop filter 330 achieves lock (lock time, lock-up time or settling time) and damping behavior. Depending on the application, this may require one or more of the following: a simple proportion (gain or attenuation), an integral (low pass filter) and/or derivative (high pass filter). Loop parameters commonly examined for this are the loop's gain margin and phase margin. Common concepts in control theory can be used to design the loop filter 330.

Another common consideration in designing the loop filter 330 is limiting the amount of error signal energy (ripple) appearing at the phase detector output that is then fed to the charge pump 320 which creates a proportional correcting voltage applied to the VCO control input. This voltage modulates the VCO 340 and produces FM sidebands commonly called "reference spurs". The low pass characteristic of the loop filter 330 can be used to attenuate this energy, but a band reject "notch" may also be used With the rise of data rates provided to and from wireless devices in 3G and 4G wireless networks, power consumption has become more and more important. There is a continuous market demand to reduce the power consumption further. Since the power consumption of the basic building blocks of wireless devices has been fairly well optimized, any further decreases in power consumption can be extremely challenging.

In a typical modern transceiver, the power consumption of both the transmitter (TX) and receiver (RX) increases in proportion to increases in performance including the required RF power, linearity, gain, noise floor, etc. The combined power consumption of these building blocks can be up to about 50% of the total power consumption. Another large consumer of the transceiver power is local oscillator (LO) generation, including all the required frequency sources (like VCOs, for example).

There are very stringent requirements for phase noise (both close-in and far-off) for LO generation in both TX and RX sections (based on SNR, reciprocal mixing, TX jamming own RX and other in-band users, etc.). While the close-in noise in most case is primarily defined by phase locked loop (PLL) performance, the far-off noise is mainly due to the VCO 340 noise floor itself. Typically, for a given VCO 340 design the low level requirements on the phase noise floor are achieved via substantial bias current (power). At lower TX output power and at higher power of RX input, the requirements for a low far-off noise could be relaxed (thus the current consumption of the VCOs could be reduced).

Figure 4:
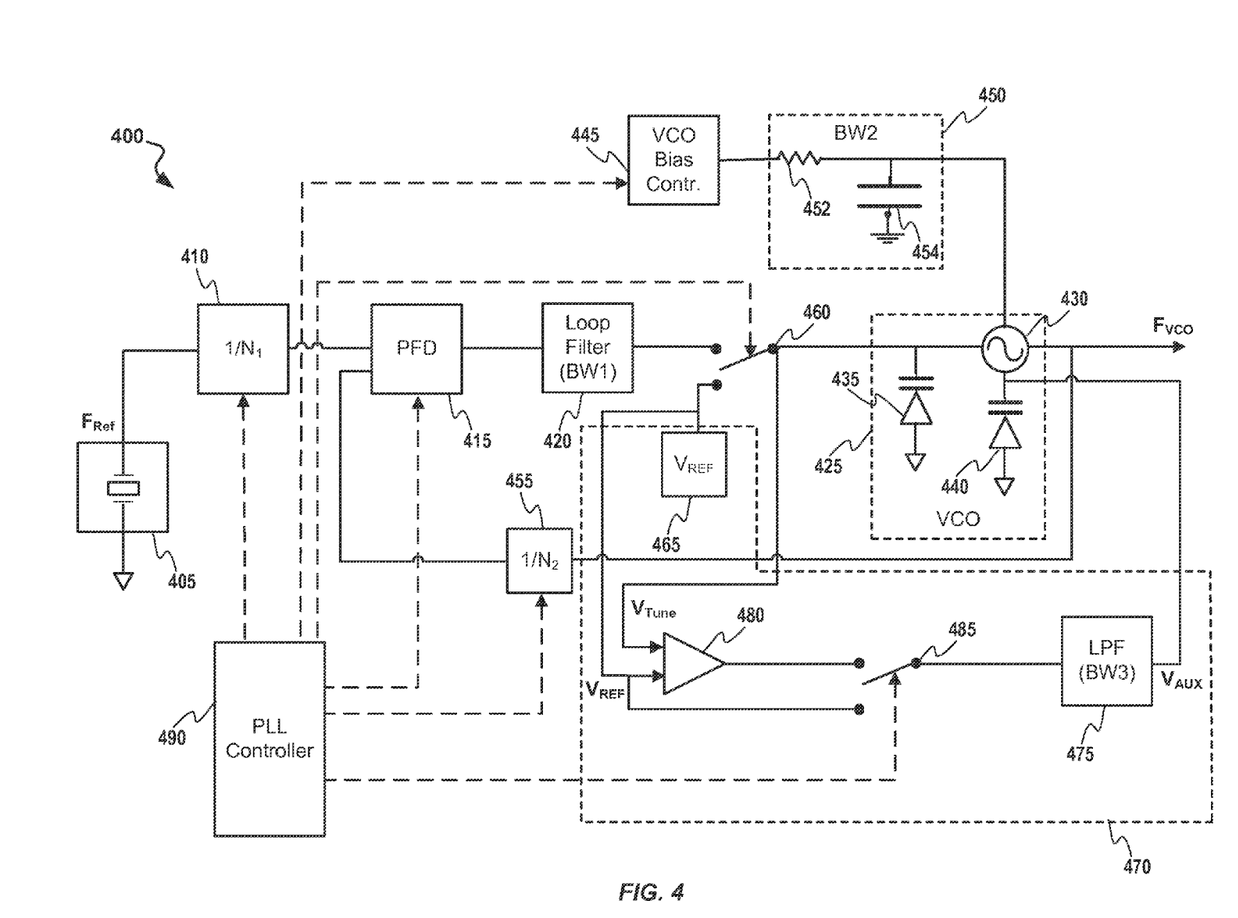
FIG. 4 illustrates a block diagram of an exemplary frequency synthesizer including an auxiliary feedback mechanism for compensating for time-variations in VCO frequency.

For 3G and 4G networks, the operation in most of the utilization cases demands simultaneous RX and TX. When changing the operating frequency of VCO 340, in order to switch from TX to RX and vice versa, a change in the current supplied to the VCO 340 is typically made. This change in current to the VCO 340 has typically been compensated by the PLL 300 via a change in the capacitance of a varactor by changing a voltage or current supplied to the varactor. Unfortunately, the frequency range of typical PLL compensation is relatively small because of the limited tuning range of the varactor, the limited range of the tuning voltage (taking into account the charge-pump 320 linearity restrictions), a need to support additional frequency drift over temperature, and the impact of the PLL bandwidth on LO noise, for example. It may be possible to choose a different capacitance value from the main capacitance bank of the VCO 340 LC tank. However, during this process, the phase of the LO will change instantly and a phase transient will occur due to the PLL re-locking process. Both of these deficiencies are not allowed to take place in 3G and 4G frequency division duplex (FDD) operations. As such, a PLL 300, according to the subject disclosure, can be configured to use an auxiliary feedback mechanism for compensating for time-variation in VCO frequency as described in more detail below FIG. 4 illustrates a block diagram of an exemplary frequency synthesizer 400 including an auxiliary feedback mechanism for compensating for time-variations in VCO frequency in accordance with the disclosure. The example frequency synthesizer 400 includes three major subsystems. The three subsystems include the following:

1. A PLL subsystem includes a reference frequency input 405, an optional feed forward divider 410, a phase-frequency detector (PFD) 415, a loop filter 420, a PLL loop switch 460, and an optional feedback divider 455 and a PLL controller 490;
2. A VCO subsystem includes a VCO circuit 425 including an oscillator 430, a main varactor (or other variable capacitance diode device) 435, an auxiliary varactor (or other variable capacitance diode device) 440, a VCO bias controller 445, and a VCO low pass filter 450 including a resister 452 and a capacitor 454; and
3. An auxiliary servo loop subsystem 470 includes a reference voltage source 465, an auxiliary low pass filter 475, a comparator 480 and an auxiliary loop switch 485.

The PLL Controller 490 provides control signals (represented by dashed lines in FIG. 4) to portions of the frequency synthesizer 400 including, but not limited to, the feed forward divider 410, the PFD 415, the VCO bias controller 445, the PLL loop switch 460 and the auxiliary loop switch 485. These control signals provide inputs specifying numerical inputs N1 and N2 for the feed forward divider 410 and the feedback divider 485, respectively. The control signals also open and close the PLL loop switch 460 and the auxiliary loop switch 485 in order to switch from coarse tuning to fine tuning, and vice versa, as will be described below. When in the fine tuning mode (with the PLL switch coupling the VCO 425 to the loop filter 420), the PLL subsystem component performs in a similar fashion to the components of the PLL 300 shown in FIG. 3 during the fine tuning mode.

The auxiliary servo loop 470 serves as an auxiliary controller circuit and provides a way to reduce power consumption in the VCO 425. In order for the auxiliary servo loop 470 to control the VCO 425, another frequency control port is added to the VCO 425, the auxiliary varactor 440 in this example. This auxiliary varactor 440 is not controlled by the PLL subsystem (at least not substantially) but rather by a narrow bandwidth, low noise feedback sub-system that samples the operating voltage of the main varactor 435, then compares it with the reference voltage $V_{ref}$ 465 and tunes the auxiliary varactor 440 to compensate for the slow frequency change/drift of the operating voltage $V_{Tune}$ of the VCO 425.

The auxiliary servo loop 470 is able to compensate for changes in operating voltage $V_{Tune}$ of the VCO 425 caused by both the temperature drift of the VCO as well as potential frequency changes due to VCO operating current change. Because both the temperature drift and the current control of the VCO are relatively slow processes, there is no need for a wide band servo loop. Thus the auxiliary servo loop 470 can be a narrow bandwidth, low gain, low noise implementation.

During the coarse tuning mode, the PLL controller 490 selectively activates switches in an LC tank (not shown) to cause the oscillator 430 of the VCO 425 to produce a frequency as close as possible to a target frequency. During the coarse tuning mode, the PLL controller 490 controls the PLL loop switch 460 and the auxiliary loop switch 485 to be coupled directly to $V_{ref}$. In this way, both the main varactor 435 and the auxiliary varactor 440 are biased to the $V_{ref}$ 465 voltage in an open loop fashion. After completing the coarse tuning mode, the PLL controller 490 controls the PLL loop switch 460 and the auxiliary loop switch 485 to be coupled to loop filter 420 and comparator 480, respectively. During the fine tuning mode, the main varactor 435 functions similarly to varactors in other PLLs. However, the auxiliary varactor 440 serves as a compensating tuner when the frequency synthesizer 400 is in the fine tuning mode.

During the fine tuning mode, the VCO bias circuit 445 is controlled by the PLL controller 490 to provide a signal equivalent to the reference voltage signal Vref provided by the reference voltage 465. The bias voltage source 445 is capable of controlling the VCO bias current in response to the control signal provided by the PLL controller 490 based on the operating frequency of the frequency synthesizer 400.

During the fine tuning mode, the voltage to the oscillator 430 is being controlled by three signals being filtered by three filters. The loop filter 420 has a bandwidth of BW1, the VCO low pass filter has a bandwidth of BW2 and the auxiliary low pass filter 475 has a bandwidth of BW3. In general, the bandwidths of the various filters are chosen using the following relations:

BW1>>BW3, and BW3≥BW2,

The auxiliary servo loop 470 does not require either wide BW or large gain (the gain should be higher than 1). In this way, the implementation problems with respect to injected noise and avoidance of potential races between the main PLL loop and the auxiliary servo loop 470 can be minimized. The bandwidth of the auxiliary loop filter 475 is chosen in order to isolate the slow changes in operating voltage of the VCO 425 due to temperature or other factors and to filter out the higher frequency changes caused by the PLL subsystem. In this way, both the temperature drift of the VCO as well as potential frequency change due to VCO operating current change can be compensated for by the auxiliary servo loop 470. Potential current saving could be as high as 20% to 25% of the entire power consumption for the frequency synthesizer 400 compared to other systems.

The PLL controller 490 can be omitted in some embodiments. The PLL Controller 490 determines the capacitance for the capacitor bank in the coarse tuning phase. It also determines the N1 and N2 dividers for setting the frequency of the VCO output $F_{VCO}$ in reference to the $F_{Ref}$ input frequency.

Figure 5:
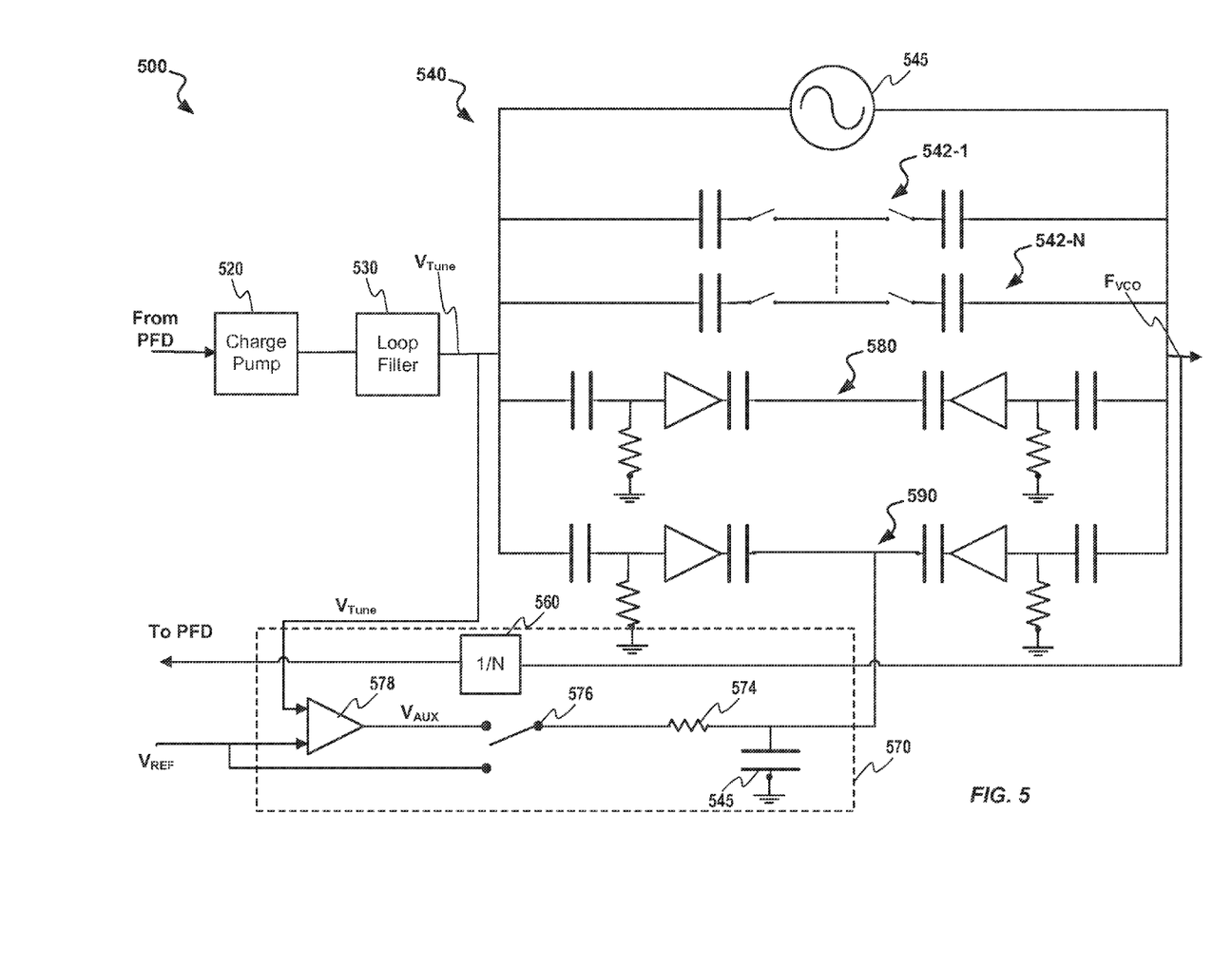
FIG. 5 illustrates exemplary circuitry that can be used in a frequency synthesizer including an auxiliary feedback mechanism for compensating for time-variations in VCO frequency.

FIG. 5 illustrates circuitry 500 that can be used in a frequency synthesizer including an auxiliary feedback mechanism for compensating for time-variations in VCO frequency in accordance with the disclosure. The circuitry 500 includes a charge pump 520, a loop filter 530, a VCO 540 and an auxiliary servo loop 570. In reference to the frequency synthesizer 400 of FIG. 4, the circuitry 500 illustrates the signal flow during the fine tuning mode when the PLL loop switch 460 is connected to the loop filter 420.

The VCO 540 includes an oscillator 545, a band of switched capacitances including a first capacitance circuit 542-1 and a second capacitance circuit 542-2. The switches of the capacitance circuits 542 are activated and deactivated by the PLL controller 490 during the coarse tuning mode as described above.

The VCO 540 also includes a main varactor circuit 580 and an auxiliary varactor circuit 590. The main varactor circuit 580 and the auxiliary varactor circuit 590 are biased to the reference voltage Vref during the coarse tuning mode. The main varactor circuit 580 and the auxiliary varactor circuit 590 are both affected by the tuning voltage $V_{Tune}$ received from the loop filter 530. In addition, the auxiliary varactor circuit 590 is controlled by a compensating voltage received from the auxiliary servo loop 570. The auxiliary servo loop 570 includes a low pass filter which, in this example, is implemented by a resistor 574 and a capacitor 545. The auxiliary servo loop 570 also includes an auxiliary loop switch 576 that is connected directly to the Vref reference voltage during the coarse tuning mode and connected to a comparator 578 during the fine tuning mode. The comparator 578 compares the reference voltage $V_{ref}$ and the tuning voltage $V_{Tune}$, applies a gain factor and outputs a compensating voltage signal to be filtered by the low pass filter including the resistor 574 and the capacitor 545 and then input to the auxiliary varactor circuit 590.

The output of the VCO 540 is a frequency signal at a frequency of $F_{VCO}$ that is fed back through a frequency divider 560 to a phase-frequency detector such as the PFD 415 shown in FIG. 4.

Figure 6:
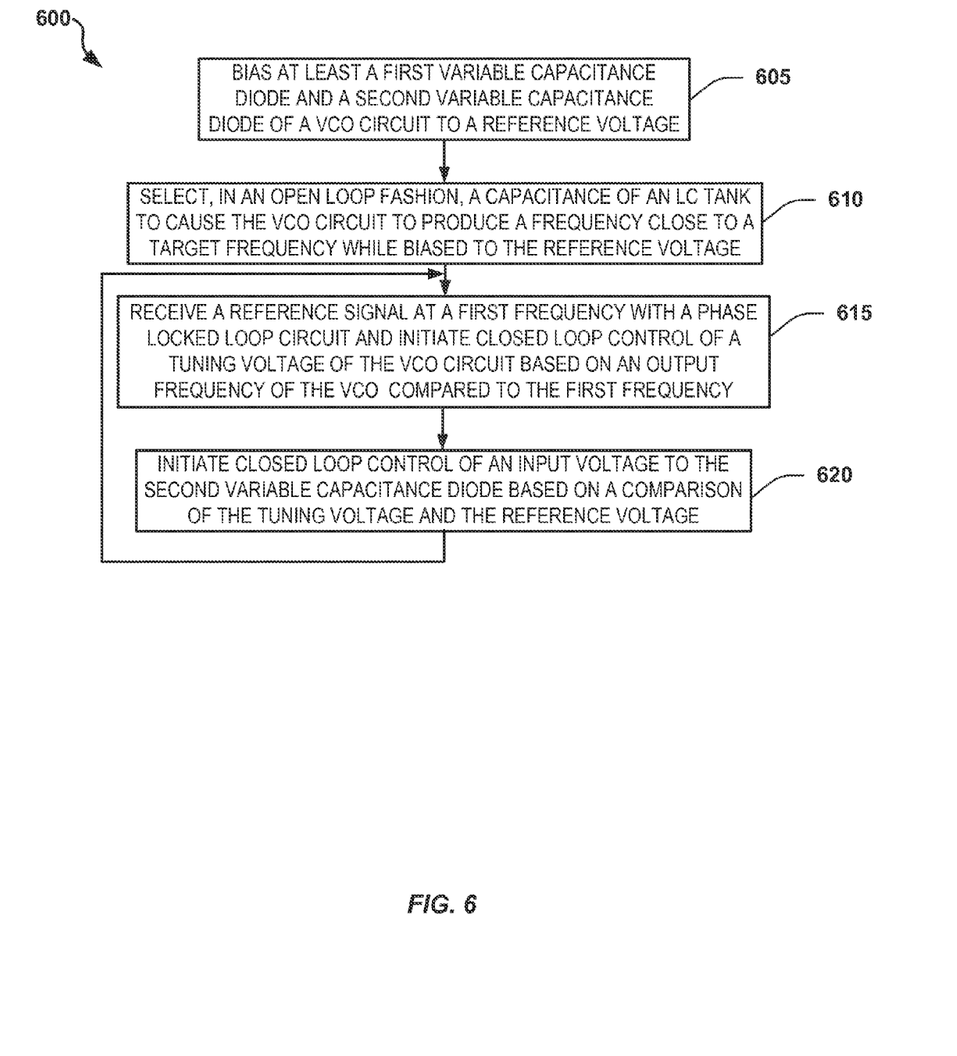
FIG. 6 illustrates a flow chart of an exemplary process utilizing an auxiliary feedback mechanism for compensating for time-variations in VCO.

FIG. 6 illustrates a flow chart of an exemplary process 600 utilizing an auxiliary feedback mechanism for compensating for time-variations in VCO frequency in accordance with the disclosure. The process 600 is exemplary only and stages can be rearranged, added or omitted, depending on the embodiment. The process 600 will be described with further reference to FIGS. 4 and 5.

At power up or upon receiving a control to switch from a first reference frequency to a second reference frequency, the PLL controller 490 initializes a coarse tuning mode, also known as a VCO frequency centering routine. At stage 605, the PLL controller 490 controls the PLL loop switch 460 and the auxiliary loop switch 485 to be coupled, in open loop fashion, to the reference voltage source 465. This means that both the main varactor 435 (or other variable capacitance diode device) and the auxiliary varactor 440 (or other variable capacitance diode device) are biased to the reference voltage $V_{ref}$. At stage 610, the PLL controller 490, based on an interim frequency count, selects a proper value of the capacitance from an LC tank of the VCO 425 to set the open loop frequency of the VCO 425 (and oscillator 430) as close as possible to a target frequency.

Upon completing the frequency centering routine (which is mainly the main varactor 435 voltage centering), the PLL controller 490 goes to the fine tuning mode by controlling the PLL loop switch 460 to be coupled to the loop filter 420 and controlling the auxiliary loop switch to be coupled to the comparator 480. At stage 615, the PFD 415 of the PLL subsystem receives a reference signal at a frequency of $F_{Ref}$ from the reference frequency input 405 (optionally divided by the feed forward divider 410). The PLL subsystem then initiates closed loop control of the tuning voltage $V_{Tune}$ based on the output frequency $F_{VCO}$ of the VCO 425 compared to the reference frequency $F_{Ref}$. At the same time, at stage 620, the auxiliary servo loop 470 initiates closed loop control of an input voltage to the auxiliary varactor 440 (or other variable capacitance diode device) based on a comparison (at the comparator 480) of the tuning voltage $V_{Tune}$, which is the current operating voltage of the VCO, and the reference voltage $V_{Ref}$. Stages 615 and 620 are repeated until the output frequency signal is no longer needed or there is a change in frequency requested, at which point, the process 600 would be started again at stage 605.

The PLL loop being performed at stage 615 could be operated for a time period without operating the auxiliary servo loop 470. Without the auxiliary servo loop 470 being active, all the variations in the VCO frequency (due to temperature, bias, etc.) could be counteracted by a change in the capacitances of the main varactor 435 and the auxiliary varactor 440 as determined by the voltage $V_{Tune}$ provided by the PLL subsystem. The range of the main varactor 425 compensation should be able to cover all VCO centering error, VCO frequency drift over temperature and supply.

With auxiliary servo loop 470 activated at stage 620, if the frequency of the VCO changes, the main frequency correction path of the PLL subsystem would compensate it precisely (within a tuning range of the PLL main control path), though the operating point of the varactor would change as well. The auxiliary servo loop 470 would compare the difference between the desired tuning voltage and the actual tuning voltage, and then it would generate an error signal that after some filtering would tune the auxiliary varactor 440 to absorb the frequency shift and to preserve the operating point of the main varactor.

With the auxiliary servo loop 470 active at stage 620, the main varactor 435 should be able to be controlled to a smaller range of voltages than without the auxiliary servo loop 470 active. With the main varactor 435 operating within a relatively narrow range, this would allow a reduction in Kvco (VCO gain) and thus an increase in the gain of the charge pump 520, which could be beneficial for a low phase-noise design. Operating the charge pump 520 in a narrower range can allow for a better matching between the sourcing and sinking arms of the charge pump 520 thus potentially reducing all related issues (levels of the comparison frequency break-through, non-linearity related fold-back noise of the delta-sigma modulator, etc.).

It should be noted that the present disclosure includes various diagrams that may depict an example architectural or other configuration for the various embodiments, which is done to aid in understanding the features and functionality that can be included in embodiments. The present disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement various embodiments. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

It should be understood that the various features, aspects and/or functionality described in one or more of the individual embodiments are not limited in their applicability to the particular embodiment with which they are described, but instead can be applied, alone or in various combinations, to one or more of the other embodiments, whether or not such embodiments are described and whether or not such features, aspects and/or functionality are presented as being a part of a described embodiment. Thus, the breadth and scope of the present disclosure should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" or "exemplary" are used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Moreover, various embodiments described herein are described in the general context of method steps or processes, which may be implemented in one embodiment by a computer program product, embodied in, e.g., a non-transitory computer-readable memory, including computer-executable instructions, such as program code, executed by computers in networked environments. A computer-readable memory may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

As used herein, the term module can describe a given unit of functionality that can be performed in accordance with one or more embodiments. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality. Where components or modules of the disclosure are implemented in whole or in part using software, in one embodiment, these software elements can be implemented to operate with a computing or processing module capable of carrying out the functionality described with respect thereto. The presence of broadening words and phrases such as "one or more," "at least," "but not limited to" or other like phrases in some instances shall not be read to mean that the narrower case is intended or required in instances where such broadening phrases may be absent.

What is claimed is:

1. An apparatus comprising:
   an oscillator circuit comprising an oscillator for producing an output signal, a first variable capacitance diode coupled to the oscillator, and a second variable capacitance diode coupled to the oscillator;
   a voltage source configured to produce a reference voltage;
   a controller circuit configured to:
      in a first mode, apply the reference voltage to both the first variable capacitance diode and to the second variable capacitance diode to cause the output signal to comprise a selected frequency;
      in a second mode:
         cause phase locked loop circuitry to apply a tuning voltage to the first variable capacitance diode to compensate for frequency changes in the output signal;
         compare the tuning voltage of the oscillator circuit to the reference voltage to produce an auxiliary voltage; and
         apply the auxiliary voltage to the second variable capacitance diode, wherein the auxiliary voltage compensates for a difference between the reference voltage and the tuning voltage.

2. The apparatus of claim 1 further comprising a first low pass configured to filter out a portion of the tuning voltage at frequencies above a first bandwidth.

3. The apparatus of claim 2 further comprising a second low pass filter configured to filter out a portion of the auxiliary voltage at frequencies above a second bandwidth.

4. The apparatus of claim 3 wherein the first bandwidth is greater than the second bandwidth.

5. The apparatus of claim 4 wherein first bandwidth is significantly greater than to the second bandwidth.

6. The apparatus of claim 1, further comprising VCO bias control circuitry configured to provide a bias control voltage to the oscillator.

7. The apparatus of claim 1, wherein the first variable capacitance diode is a first varactor.

8. The apparatus of claim 7 wherein the second variable capacitance diode is a second varactor.

9. The apparatus of claim 1, wherein the oscillator circuit produces a local oscillation for use in a Radio Frequency transceiver.

10. The apparatus of claim 1, wherein the apparatus services wireless communications.

11. A communication system comprising:
   a phase locked loop (PLL) circuit having an oscillator circuit for producing an output frequency, the PLL circuit configured to operate in a first mode and a second mode, wherein:
   when in the first mode, the PLL circuit applies a reference voltage to the oscillator circuit; and
   when in the second mode, the PLL circuit:
   applies a tuning voltage to the oscillator circuit based on a difference between the output frequency and an input reference frequency;
   compares the tuning voltage to the reference voltage to produce an auxiliary voltage; and
   applies the auxiliary voltage to the oscillator circuit, wherein the auxiliary voltage compensates for a difference between the reference voltage and the tuning voltage.

12. The communication system of claim 11 wherein the oscillator circuit further comprises a first variable capacitance diode coupled to the oscillator, and a second variable capacitance diode coupled to the oscillator.

13. The communication system of claim 12 wherein the first variable capacitance diode is a first varactor.

14. The communication system of claim 13 wherein second variable capacitance diode is a second varactor.

15. The communication system of claim 11 wherein, when in the second mode, the PLL circuit is configured to compensate for higher frequency changes than when in the first mode.

16. A method for operating an oscillator having a phase locked loop (PLL) circuit and an oscillator circuit to produce an output frequency comprising:
   in a first mode, applying a reference voltage to both a first variable capacitance diode and a second variable capacitance diode of the oscillator circuit;
   in a second mode:
   applying a tuning voltage to the first variable capacitance diode that is based on a difference between an output frequency of the oscillator circuit and an input reference frequency;
   comparing the tuning voltage of the oscillator circuit to the reference voltage to produce an auxiliary voltage; and
   applying the auxiliary voltage to the second variable capacitance diode of the oscillator circuit.

17. The method of claim 16, further comprising:
   filtering the tuning voltage with a first low pass filter so as to filter out a portion of the tuning voltage at frequencies above a first bandwidth; and
   filtering the auxiliary voltage with a second low pass filter so as to filter out a portion of the auxiliary voltage at frequencies above a second bandwidth.

18. The method of claim 17, wherein the second bandwidth is greater than the first bandwidth.

19. The method of claim 16, further comprising producing a local oscillation by the oscillator circuit.

20. The method of claim 16, further comprising using the local oscillation to service wireless communications.

* * * * *